(12) United States Patent
Yang et al.

(10) Patent No.: US 6,906,651 B2
(45) Date of Patent: Jun. 14, 2005

(54) CONSTANT CURRENT SOURCE WITH THRESHOLD VOLTAGE AND CHANNEL LENGTH MODULATION COMPENSATION

(75) Inventors: Ching Hsiang Yang, Taoyuan (TW); Chun Wei Lin, Changhua (TW)

(73) Assignee: Spirox Corporation, Hsinchu (TW)

(*) Notice: Subject to any disclaimer, the term of this patent is extended or adjusted under 35 U.S.C. 154(b) by 0 days.

(21) Appl. No.: 10/758,841

(22) Filed: Jan. 16, 2004

(65) Prior Publication Data

US 2004/0232972 A1 Nov. 25, 2004

(30) Foreign Application Priority Data

May 21, 2003 (TW) .......................... 92113768 A

(51) Int. Cl.[7] .................. H03M 1/66; K03K 19/094; K03K 19/0175
(52) U.S. Cl. ................ 341/144; 330/9; 326/83; 326/86; 326/68; 327/563
(58) Field of Search ............... 341/144; 327/530, 327/538, 205, 108, 563; 326/68, 86, 83

(56) References Cited

U.S. PATENT DOCUMENTS

| | | | | |
|---|---|---|---|---|
| 5,517,152 A | * | 5/1996 | Miki et al. ................. | 327/530 |
| 5,598,122 A | * | 1/1997 | McClure .................... | 327/538 |
| 5,619,166 A | * | 4/1997 | Gross ........................ | 327/552 |
| 5,798,658 A | * | 8/1998 | Werking .................... | 326/83 |
| 5,936,392 A | * | 8/1999 | Taylor ....................... | 323/315 |
| 6,008,679 A | * | 12/1999 | Masuda ..................... | 327/205 |
| 6,081,131 A | * | 6/2000 | Ishii .......................... | 326/68 |
| 6,320,417 B1 | * | 11/2001 | Kirsch et al. ............. | 326/86 |
| 6,515,520 B2 | * | 2/2003 | Kiyose ...................... | 327/108 |
| 6,587,000 B2 | * | 7/2003 | Oikawa ..................... | 330/288 |
| 6,621,334 B2 | * | 9/2003 | Ausserlechner et al. ... | 330/9 |
| 6,657,485 B2 | * | 12/2003 | Kimura ..................... | 327/563 |

FOREIGN PATENT DOCUMENTS

TW 230284 3/1994

OTHER PUBLICATIONS

Chin et al., *A 10b 125–MHz CMOS Digital–to–Analog Converter (DAC) with Threshold–Voltage Compensated Current Sources*, IEEE Journal of Solid–State Circuits, vol. 29, No. 11 (1994), pp. 1374–1380.

* cited by examiner

Primary Examiner—Jean Bruner Jeanglaude
(74) Attorney, Agent, or Firm—Seyfarth Shaw LLP

(57) ABSTRACT

A constant current source with threshold voltage and channel length modulation includes first, second, third, fourth and fifth MOS transistors. Each of the MOS transistors has gate, first and second terminals. The first terminal of the second MOS transistor is coupled to loading impedance, and its second terminal is coupled with the first terminal of the first MOS transistor. The gate terminal and first terminal of the third MOS transistor are together coupled to the gate terminal of the second MOS transistor, and its second terminal is coupled to the first terminal of the fourth MOS transistor. The gate terminal and first terminal of the fourth MOS transistor are coupled to the gate terminal of the first MOS transistor, and its second terminal is coupled to a first reference voltage. The gate terminal and second terminal of the fifth MOS transistor are respectively coupled to a second reference voltage and a third reference voltage, and its first terminal is coupled to the gate terminal and first terminal of the third MOS transistor.

16 Claims, 3 Drawing Sheets

CONSTANT CURRENT SOURCE WITH THRESHOLD VOLTAGE AND CHANNEL LENGTH MODULATION COMPENSATION

BACKGROUND OF THE INVENTION

1. Field of the Invention

The present invention relates to a constant current source with threshold voltage and channel length modulation compensation, and more particularly to a current source that is applicable to digital-analog converter (DAC).

2. Description of the Related Art

DAC is the most commonly used circuit in integrated circuit (IC) design fields, and can usually be divided into active component type and passive component type. Passive DAC applies resistors or capacitors to complete such a circuit design. Because the passive components have a larger chip thereon, the matching between these passive components has to be taken into consideration. Furthermore, they need to be accompanied with high-efficiency operational amplifiers to have a good performance, so most current circuit designs don't adopt passive components and tend to adopt active components.

The active components generally can be divided into weighted current source, current cell matrix and switched-current modes in the design field of the DAC circuit. All of the above three modes of the active components have current sources formed by a plurality of current source cells, and make use of some switch components to switch current source cells so as to have various signal conversions.

As shown in FIG. 1, a circuit diagram of a conventional 10-digit DAC, the circuit adopts binary weighted current source for a design mode. The DAC includes 1023 current source cells 11 and ten weighted current source $I_0$, $2I_0$, $4I_0$, ..., and $512I_0$ formed by current source cells 11. The output signal can obtain 10-digit resolution by controlling the ten switches 12.

However, because the aforementioned circuit makes use of more than one thousand current source cells 11, the homogeneities of the current source cells 11 output current are very important; otherwise, it is impossible to obtain a DAC with a high resolution or high yield ratio.

FIG. 2 is a circuit diagram of a conventional current source cell. The output current $I_1$ of a current source cell 20 can be formulated by the following formula:

$$I_1 = K_1 \frac{W_1}{L_1}(V_a - V_{th})^2 \quad \text{(Formula 1)}$$

wherein $K_1 = \mu_n C_{ox}/2$, $\mu_n$ is electron mobility, Cox is the capacitor value of the unit area, $W_1$ is the channel width of a Metal Oxide Semiconductor (MOS) transistor M1, $L_1$ is the channel length of the MOS transistor M1, Va is the bias voltage of the gate terminal and $V_{th}$ is the threshold voltage.

From Formula 1, current $I_1$ is variable with the threshold voltage $V_{th}$ of the MOS transistor M1, so it is unacceptable for a high resolution DAC. In addition, not only the threshold voltage $V_{th}$ may shift with the manufacture process conditions, but also the great current source cells of a DAC may have a poor PSRR (Power Supply Rejection Ratio; PSRR), which results in a distorted conversion.

To obtain a DAC with a better PSRR, another current source cell 30 is disclosed by Taiwan Patent No.230,284, as shown in FIG. 3. The output current $I_2$ of the current source cell 30 can be simplified into the following formula:

$$I_2 = K_2 \frac{W_2}{L_2}(V_{R1})^2(1 + \lambda V_{DS2}) \quad \text{(Formula 2)}$$

wherein $K_2$ is a constant coefficient same in physics meaning as $K_1$ in Formula 1, $W_2$ is the channel width of MOS transistor M2, $L_2$ is the channel length of a MOS transistor M2, $V_{R1}$ is a first reference voltage; $V_{DS2}$ is the relative voltage between the base electrode and source electrode of the MOS transistor M2, $\lambda$ is a coefficient and the whole term $(1+\lambda VDS2)$ expresses the effect of channel length modulation.

Referring to the formula 2, because $V_{R1}$ is a constant value, the output current $I_2$ is in proportion to $V_{DS2}$. However, $V_{DS2}$ is also variable with the variance of the threshold voltage $V_{th}$ of the MOS transistor M1. Compared to the current source cell 20 in FIG. 2, the relation between output current $I_2$ and $V_{th}$ is rewritten in the power of one from the power of two, so the PSRR of the current source cell 30 is likely to be slightly improved.

However, the current source cell 30 in FIG. 3 still cannot meet the requirements of a high resolution DAC. Therefore, a current source with a lower PSRR is progressively demanded for a DAC field to solve all aforementioned disadvantages in DAC.

SUMMARY OF THE INVENTION

The first objective of the present invention is to provide a constant current source with threshold voltage and channel length modulation compensation. A compensation circuit is added in the circuit of a current source cell, and enables a robustness performance in a whole current source that possesses a superior PSRR.

The second objective of the invention is to provide a current source with optimal circuit design. Through adjusting corresponding parameters to minimize the variance of an output current, the current source can be widely applied in the DAC circuit design.

In order to achieve these objectives, the present invention discloses a constant current source with threshold voltage and channel length modulation, which includes a first MOS transistor, a second MOS transistor, a third MOS transistor, a fourth MOS transistor and a fifth MOS transistor. Each of the MOS transistors has a gate terminal, a first terminal and a second terminal. The first terminal of the second MOS transistor is coupled to a loading impedance, and its second terminal is coupled with the first terminal of the first MOS transistor. The gate terminal and the first terminal of the third MOS transistor are coupled together to the gate terminal of the second MOS transistor, and its second terminal is coupled to the first terminal of the fourth MOS transistor. The gate terminal and first terminal of the fourth MOS transistor are coupled to the gate terminal of the first MOS transistor, and its second terminal is coupled to a first reference voltage. The gate terminal and second terminal of the fifth MOS transistor are respectively coupled to a second reference voltage and a third reference voltage, and its first terminal is coupled to the gate terminal and first terminal of the third MOS transistor.

BRIEF DESCRIPTION OF THE DRAWINGS

The invention will be described according to the appended drawings in which.

PREFERRED EMBODIMENT OF THE PRESENT INVENTION

Figure 1:
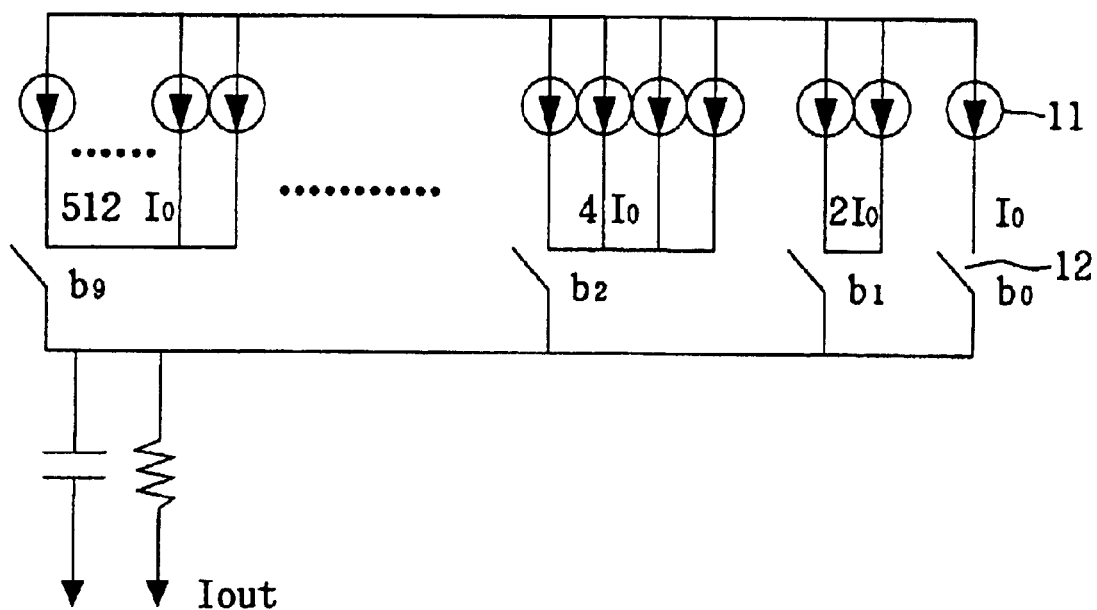
FIG. 1 is a circuit diagram of a conventional 10-digit DAC.
Figure 2:
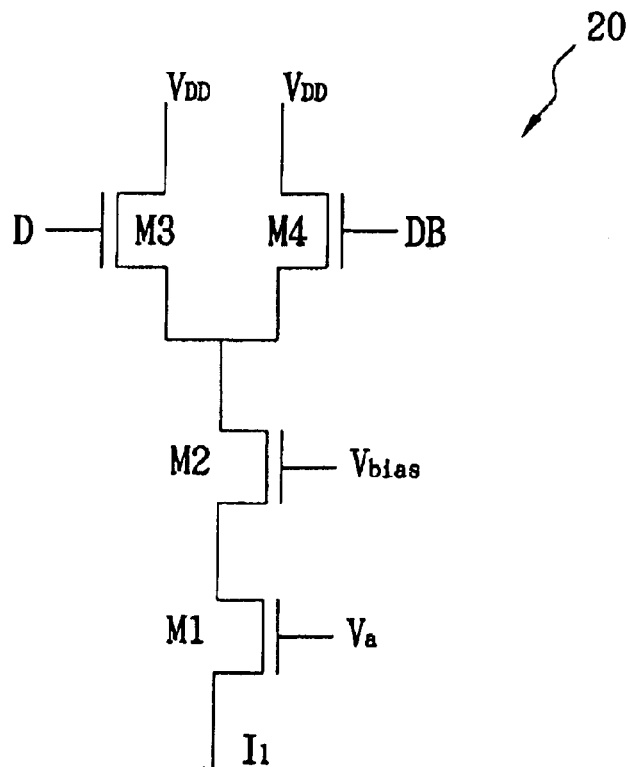
FIG. 2 is a circuit diagram of a conventional current source cell.
Figure 3:
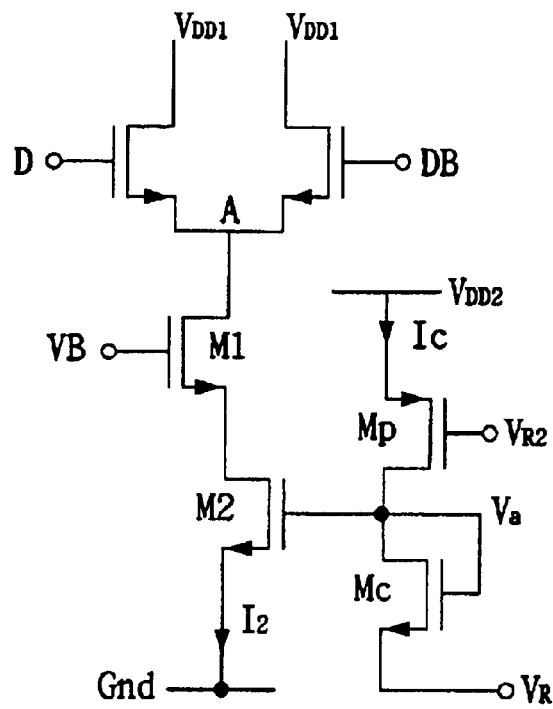
FIG. 3 is a circuit diagram of a conventional current source cell.
Figure 4:
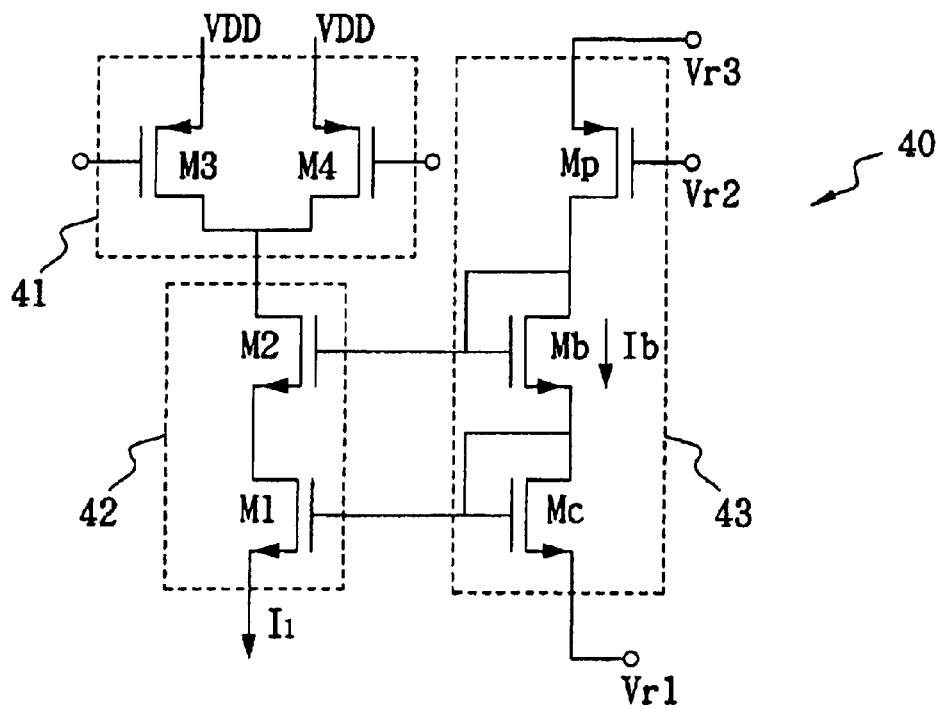
FIG. 4 is a circuit diagram of a current source cell in accordance with the present invention.

FIG. 4 is a circuit diagram of a current source cell in accordance with the present invention. The current source cell 40 of the present invention includes a first MOS transistor M1, a second MOS transistor M2, a third MOS transistor Mb, a fourth MOS transistor Mc and a fifth MOS transistor Mp. In addition, a MOS transistor M3 and a MOS transistor M4 can be added to the circuit as a switch circuit 41 that can control the direction of an input current. Furthermore, the voltage VDD of the first power supply is together coupled to the source electrodes of the P-type MOS transistor M3 and MOS transistor M4. The first MOS transistor M1 and the second MOS transistor M2 form a cascade transistor 42. The third MOS transistor Mb, the fourth MOS transistor Mc and the fifth MOS transistor Mp form a compensation circuit 43 that can reduce the influences of threshold voltage of the cascade transistor 42 on the output current $I_1$.

The drain electrode of the second MOS transistor M2 is coupled to the drain electrode of the P-type switch circuit 41. The gate terminal and drain electrode of the third transistor Mb are connected with each other to form a diode, and all are together coupled to the gate terminal of the second MOS transistor M2. The gate terminal of the fourth MOS transistor Mc is coupled to its drain electrode to form a diode, and is also coupled with the gate terminal of the fourth MOS transistor M1. The fourth MOS transistor Mc, the third MOS transistor Mb and the fifth MOS transistor Mp of the compensation circuit 43 are connected in a series to form a reference current $I_b$. The source electrode of fourth MOS transistor Mc is coupled to a first reference voltage Vr1, while the gate terminal and source electrode of the fifth transistor Mp are respectively coupled to the second reference voltage Vr2 and the third reference voltage Vr3.

The first MOS transistor M1, the second MOS transistor M2, the third MOS transistor Mb, the fourth MOS transistor Mc and the fifth MOS transistor Mp can be N-type MOS transistors (N channel) or P-type MOS transistors (P channel). However, if the polarities of the MOS transistors in FIG. 4 are changed, the connections of the source electrode and the drain electrode should interchange, and the polarity of the bias voltage applied on a gate terminal should also be changed. To simplify all relative descriptions, the drain electrode and the source electrode of each MOS transistor is defined as a first terminal and a second terminal, respectively. The definitions of the first terminal and the second terminal depend on the polarities of the MOS transistor that is adopted.

In order to obtain the optimal compensation result of the threshold voltage and the channel length modulation on the cell current source 40, the transistor parameters can be controlled during the manufacture process to reach desired physical characteristics. First, the threshold voltage $V_{th2}$ of the second MOS transistor M2 should be decreased to be as low as possible, and the threshold voltages of the second MOS transistor M2 and the third transistor Mb should be kept in consistency ($V_{thb}=V_{th2}$). On the other hand, if the threshold voltages $V_{th2}$ and $V_{thb}$ are decreased, the current Ib passing through the channel of third transistor Mb becomes larger. The fifth transistor Mp can be regarded as a resistor with constant resistance. The bias voltage $V_b$ applied on the gate terminal of the third transistor Mb is decreased, when the current Ib becomes larger. Finally, the decrease of bias-voltage $V_b$ can result in the decrease of bias-voltage $V_{GS2}$ between the gate terminal and second terminal of the second MOS transistor M2, and a predetermined compensation effect is achieved this way.

In other words, the present invention has a feedback circuit formed by the third MOS transistor Mb and the fourth MOS transistor Mc of the compensation circuit 43 and the first MOS transistor M1 and the second MOS transistor M2 of the cascaded transistor 42 to achieve a low PSRR function.

Output current $I_1$ can be formulated by the following formula:

$$I_1 = K_1 \frac{W_1}{L_1}(V_{r1})^2(1+\lambda V_{DS1}) \quad \text{(Formula 3)}$$

wherein $K_1$ is a constant as the same physical meaning as $K_1$ in formula 1, $W_1$ is the channel width of the first MOS transistor M1, $L_1$ is the channel length of the MOS transistor M1, $V_{r1}$ is the first reference voltage; $V_{DS1}$ is the relative voltage between the drain electrode and source electrode of the first MOS transistor M1, $\lambda$ is a coefficient and the whole term $(1+\lambda V_{DS1})$ expresses the effect of the channel length modulation.

The $V_{DS1}$ can be denoted by the following formula:

$$\begin{aligned} V_{DS1} &= V_b - V_{th2} - V_{OD2} \quad \text{(Formula 4)} \\ &= V_{r3} - k_b(V_{GSb} - V_{thb})^2 \times R_{on} - V_{th2} - V_{OD2} \\ &= -k_b R_{on} V_{th2}^2 + (2 \times k_b V_{GSb} R_{on} - 1) \times \\ &\quad V_{th2} + V_{R3} - k_b R_{on} V_{GSb}^2 - V_{OD2} \\ &= V_{th2}^2 - \left(2V_{GSb} - \frac{1}{k_b R_{on}}\right)V_{th2} + V_{GSb}^2 - V_{OD2} \end{aligned}$$

wherein $V_{th2}$ is the threshold voltage of the second MOS transistor M2, $V_{OD2}$ ($V_{OD2}=V_{GS2}-V_{th2}$) is the over-driving voltage of the second MOS transistor M2, $K_b$ is the parameter of the third MOS transistor Mb, $V_{GSb}$ is the bias voltage between the gate terminal and second terminal of the third MOS transistor Mb and $R_{on}$ is the equivalent resistance of the fifth MOS transistor Mp.

The formula 4 is finally simplified as the quadratic parabolic curve of the $V_{th2}$ and $V_{DS1}$, and the most insensitive design range of $V_{DS1}$ to $V_{th2}$ can be obtained through the quadratic parabolic curve. It is determined by $$\frac{\partial V_{DS1}}{\partial V_{th2}} = 0 \Rightarrow V_{th2}(V_{DS1,\min}) = V_{GSb} - \frac{1}{2k_b R_{on}}$$

wherein $V_{th2}$ ($V_{DS1'min}$) is the corresponding value of $V_{th}$ when VDS1 is a minimum.

Figure 5:
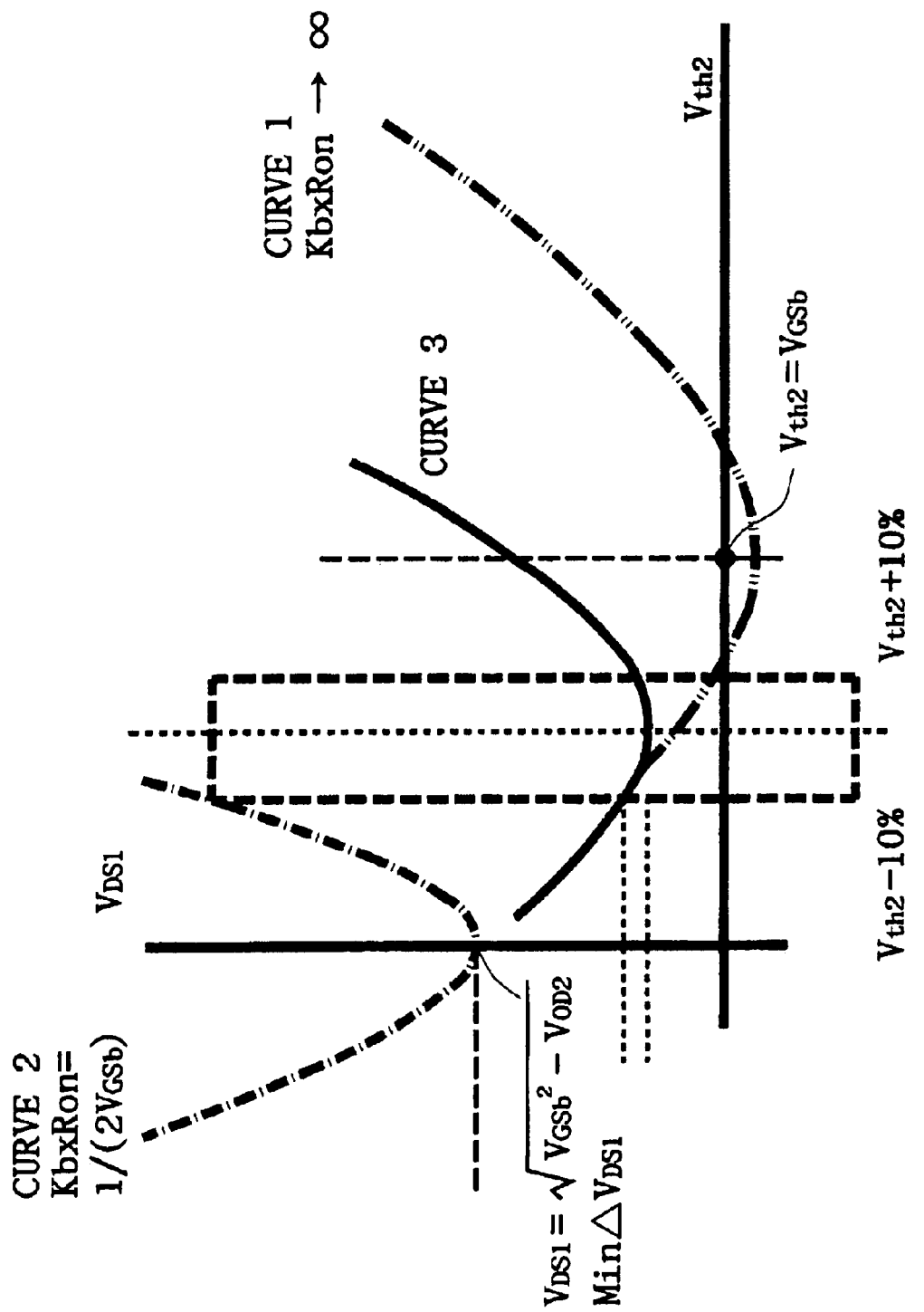
FIG. 5 shows quadratic curves of Formula 4 in accordance with the present invention.

FIG. 5 shows quadratic curves of the formula 4 in accordance with the present invention. Curve 1 represents the relation between $V_{DS1}$ and $V_{th2}$ when the compound parameter $K_b \times R_{on}$ approximates infinite. The curve 2 represents the relation between $V_{DS1}$ and $V_{th2}$ when the compound parameter $K_b \times R_{on}$ equals $V_{GSb}/2$. The curve 1 and curve 2 are based on two extra conditions, and a common practical condition is shown as represented by the curve 3. The optimal design is considered to obtain the $K_b \times R_{on}$ value corresponding to the central symmetry point of the curve 3, because even if Vth2 is varied within ±10% around the central symmetry point, the minimal variance of $V_{DS1}$ can be obtained, i.e., MIN$\Delta V_{DS1}$.

The most robust current source cell can be obtained through the above-described optimal design considerations. Then, we can use a computer to further analyze and simulate the performances of the optimal current source cell by a Monte-Carlo method. The simulation conditions can assume that $V_{th1} V_{th2} V_{thb} V_{thc}$ and $V_{thp}$ all have their Gaussian distribution wit 10% (=3σ) variances, and the variable range of the power supply voltage VDD is from 2.7V to 3.9V. Then, we can obtain 0.15% PSRR as a good performance in comparison with conventional technologies.

The above-described embodiments of the present invention are intended to be illustrative only. Numerous alternative embodiments may be devised by persons skilled in the art without departing from the scope of the following claims.

What is claimed is:

1. A constant current source with threshold voltage and channel length modulation, comprising:
    a first MOS transistor including a gate terminal, a first terminal and a second terminal;
    a second MOS transistor including a gate terminal, a first terminal and a second terminal, wherein the second terminal is coupled to the first terminal of the first MOS transistor;
    a third MOS transistor including a gate terminal, a first terminal and a second terminal, wherein the gate terminal and the first terminal are coupled to the gate terminal of the second MOS transistor,
    a fourth MOS transistor including a gate terminal, a first terminal and a second terminal, wherein the gate terminal and the first terminal are coupled to the gate terminal of the first MOS transistor and the second terminal of the third MOS transistor, and the second terminal is coupled to a first reference voltage; and
    a fifth MOS transistor acting as a resistor and electrically connected to the gate terminal and the first terminal of the third MOS transistor.

2. The constant current source with threshold voltage and channel length modulation of claim 1, wherein the second terminal of the first MOS transistor is used for outputting current of the current source.

3. The constant current source with threshold voltage and channel length modulation of claim 1, wherein the fifth MOS transistor has a gate terminal, a first terminal and a second terminal, and the gate terminal and the second terminal are respectively coupled to a second reference voltage and a third reference voltage.

4. The constant current source with threshold voltage and channel length modulation of claim 1, wherein the second MOS transistor is coupled to a voltage supply by way of a switch circuit.

5. The constant current source with threshold voltage and channel length modulation of claim 4, wherein the switch circuit includes two MOS transistors whose second terminals are together coupled to the first terminal of the second MOS transistor and whose first terminals are together coupled to the voltage supply.

6. The constant current source with threshold voltage and channel length modulation of claim 1, wherein the first, second, third and fourth MOS transistors are N-type MOS transistors, the fifth transistor is a P-type MOS transistor and the first and second terminals are drain and source electrodes, respectively.

7. The constant current source with threshold voltage and channel length modulation of claim 1, wherein the output current of the constant current source is formulated as follows:

$$I_1 = K_1 \frac{W_1}{L_1} (V_{r1})^2 (1 + \lambda V_{DS1})$$

wherein $K_1$ is a parameter of the first MOS transistor, $W_1$ is the channel width of the first MOS transistor, $L_1$ is the channel length of the first MOS transistor, $V_{r1}$ is the first reference voltage, $V_{DS1}$ is the relative voltage between the first and second terminals of the first MOS transistor and λ is a coefficient.

8. The constant current source with threshold voltage and channel length modulation of claim 7, wherein the $V_{DS1}$ satisfies the following formula:

$$V_{DS1} = V_{th2}^2 - \left(2V_{GSb} - \frac{1}{k_b R_{on}}\right) V_{th2} + V_{GSb}^2 - V_{OD2}$$

wherein $V_{th2}$ is the threshold voltage of the second MOS transistor, $V_{OD2}$ is the over-driving voltage of the second MOS transistor, $K_b$ is a parameter of the third MOS transistor, $V_{GSb}$ is the bias voltage between the gate terminal and second terminal of the third MOS transistor and $R_{on}$ is the equivalent resistance of the fifth MOS transistor.

9. The constant current source with threshold voltage and channel length modulation of claim 8, wherein the $V_{th2}$ is substantially equal to $$V_{GSb} - \frac{1}{2k_b R_{on}}.$$

10. A constant current source with threshold voltage and channel length modulation, comprising:
    a set of cascade transistors including a first MOS transistor and a second MOS transistor; and
    a compensation circuit electrically connected to the first MOS transistor and the second MOS transistors so as to form a feedback circuit, the compensation circuit including:
    a third MOS transistor having a gate terminal coupled to the gate terminal of the second MOS transistor;
    a fourth MOS transistor having a gate terminal, a first terminal and a second terminal, the fourth MOS transistor being in a series connection with the third MOS transistor, wherein the gate terminal is coupled to the gate terminal of the first MOS transistor and the second terminal is coupled to a first reference voltage;
    and a resistor with constant resistance electrically connected to the third MOS transistor.

11. The constant current source with threshold voltage and channel length modulation of claim 10, wherein the third and fourth MOS transistors act as diodes.

12. The constant current source with threshold voltage and channel length modulation of claim 10, wherein the resistor with constant resistance is a fifth MOS transistor which has a gate terminal, a first terminal and a second terminal, and the gate and second terminals are separately connected to a second reference voltage and a third reference voltage.

13. The constant current source with threshold voltage and channel length modulation of claim 10, wherein the set of cascade transistors is further coupled to a switch circuit.

14. The constant current source with threshold voltage and channel length modulation of claim 10, wherein the output current of the constant current source is formulated as follows:

$$I_1 = K_1 \frac{W_1}{L_1}(V_{r1})^2(1+\lambda V_{DS1})$$

wherein $K_1$ is a parameter of the first MOS transistor, $W_1$ is the channel width of the first MOS transistor, $L_1$ is the channel length of the first MOS transistor, $V_{r1}$ is the first reference voltage; $V_{DS1}$ is the relative voltage between the first terminal and the second terminal of the first MOS transistor and $\lambda$ is a coefficient.

15. The constant current source with threshold voltage and channel length modulation of claim 14, wherein the $V_{DS1}$ satisfies the following formula:

$$V_{DS1} = V_{th2}^2 - \left(2V_{GSb} - \frac{1}{k_b R_{on}}\right)V_{th2} + V_{GSb}^2 - V_{OD2}$$

wherein $V_{th2}$ is the threshold voltage of the second MOS transistor, $V_{OD2}$ is the over-driving voltage of the second MOS transistor, $K_b$ is a parameter of the third MOS transistor, $V_{GSb}$ is the bias voltage between the gate terminal and second terminal of the third MOS transistor and $R_{on}$ is the equivalent resistance of the fifth MOS transistor.

16. The constant current source with threshold voltage and channel length modulation of claim 15, wherein the $V_{th2}$ is substantially equal to $$V_{GSb} - \frac{1}{2k_b R_{on}}.$$

* * * * *